United States Patent
Freeman et al.

(10) Patent No.: US 7,259,466 B2
(45) Date of Patent: Aug. 21, 2007

(54) LOW TEMPERATURE BONDING OF MULTILAYER SUBSTRATES

(75) Inventors: William Freeman, Castro Valley, CA (US); Hong Jin Jiang, Singapore (SG)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/740,241

(22) Filed: Dec. 17, 2003

(65) Prior Publication Data
US 2005/0011669 A1 Jan. 20, 2005

Related U.S. Application Data

(60) Provisional application No. 60/435,316, filed on Dec. 17, 2002.

(51) Int. Cl.
*H01L 29/80* (2006.01)
*H01L 31/112* (2006.01)
(52) U.S. Cl. .................................. 257/783; 257/782
(58) Field of Classification Search ............... 257/783, 257/782, 2, 16; 438/118, 96
See application file for complete search history.

(56) References Cited

U.S. PATENT DOCUMENTS

| | | | |
|---|---|---|---|
| 4,883,215 A | 11/1989 | Goesele et al. | |
| 5,277,748 A * | 1/1994 | Sakaguchi et al. | 438/406 |
| 5,318,652 A | 6/1994 | Hocker et al. | |
| 5,346,848 A * | 9/1994 | Grupen-Shemansky et al. | 438/406 |

(Continued)

FOREIGN PATENT DOCUMENTS

EP 0 441 270 B1 8/1991

(Continued)

OTHER PUBLICATIONS

David G. Morrison, *Interconnects, Packaging, Interconnects Move to the Fore*, Electronic Design, Jan. 7, 2002, pp. 89-93.

(Continued)

*Primary Examiner*—Sheila V. Clark
(74) *Attorney, Agent, or Firm*—Workman Nydegger

(57) ABSTRACT

Exemplary embodiments of the present invention are drawn to improved systems and process for anodically bonding multiple substrate wafers to each other at low temperatures. At least one circuit wafer having printed circuits thereon is bonded to an interposer wafer by applying an amorphous thin film between the wafers. A low voltage is applied across the wafers to heat the wafers and to cause bonding of the wafers. Multiple circuit and interposer wafers can be used. The bonding temperature is low enough that soldered connections on the circuit wafers will not flow or otherwise distort, thus maintaining electrical integrity.

19 Claims, 5 Drawing Sheets

U.S. PATENT DOCUMENTS

| | | | |
|---|---|---|---|
| 6,168,678 B1 | 1/2001 | Plankenhorn et al. | |
| 6,180,496 B1 | 1/2001 | Farrens et al. | |
| 6,300,687 B1 * | 10/2001 | Bertin et al. | 257/784 |
| 6,627,998 B1 * | 9/2003 | Caletka et al. | 257/778 |
| 6,975,035 B2 * | 12/2005 | Lee | 257/778 |
| 5,395,481 A * | 3/1995 | McCarthy | 438/479 |
| 5,407,856 A | 4/1995 | Quenzer et al. | |
| 5,413,955 A | 5/1995 | Lee et al. | |
| 5,414,276 A * | 5/1995 | McCarthy | 257/57 |
| 5,663,078 A * | 9/1997 | McCarthy | 438/157 |
| 5,695,590 A | 12/1997 | Wilcox et al. | |
| 5,728,624 A | 3/1998 | Linn et al. | |
| 5,820,648 A | 10/1998 | Akaike et al. | |
| 5,843,832 A | 12/1998 | Farmer et al. | |
| 5,866,469 A | 2/1999 | Hays | |
| 6,008,113 A | 12/1999 | Ismail et al. | |
| 6,159,824 A | 12/2000 | Henley et al. | |

FOREIGN PATENT DOCUMENTS

| | | |
|---|---|---|
| EP | 0 664 557 A2 | 7/1995 |
| JP | 61-145839 | 7/1986 |
| JP | 62-265728 | 11/1987 |
| JP | 63-111652 | 5/1988 |
| JP | 09/97755 | 4/1997 |
| JP | 11-219872 | 8/1999 |
| JP | 2000-121468 | 4/2000 |
| KR | 1990-0003249 | 5/1990 |
| WO | WO 01/29890 A2 | 4/2001 |

OTHER PUBLICATIONS

John Baliga, *High-Density Packaging: The Next Interconnect Challenge*, Alpine Microsystems, Feb. 2000.

* cited by examiner

LOW TEMPERATURE BONDING OF MULTILAYER SUBSTRATES

CROSS-REFERENCE TO RELATED APPLICATIONS

This patent claims priority to and the benefit of U.S. Provisional Patent Application Ser. No. 60/435,316, filed Dec. 17, 2002, and entitled "Low Temperature Bonding of Multilayer Glass", which is incorporated herein by reference in its entirety.

BACKGROUND OF THE INVENTION

1. The Field of the Invention

This invention relates generally to the field of bonding stacked silicon and glass wafers. In particular, exemplary embodiments of the present invention relate to improved devices and methods of anodically bonding multiple wafers or layers.

2. The Relevant Technology

Anodic bonding, also known as field assisted glass-silicon sealing, is a process which permits the sealing of silicon to glass at a temperature below the melting point of glass. The silicon and glass pieces, wafers, layers are heated by an electrical device to about 400-500 degrees C. FIG. 1 illustrates one general system that can be used to anodically bond silicon and glass wafers, layers, or substrates. The electrical device, such as a voltage source 105, applies a voltage across the wafers on the order of mid to high 100s of volts to heat up the wafers to the required temperature. Generally, a positive terminal 106 of the electrical device is connected to an anode, such as aluminum plate 125, located on or below a silicon wafer 120. Likewise, negative terminal 108 of the electrical device is connected to a cathode 110 located on or above a glass wafer 115. After applying voltage across the wafers one time, the silicon and glass are bonded together and can be cooled to room temperature.

This type of bonding is thought to be the result of mobile ions in the glass wafer. At higher temperatures, the negative ions on cathode 110 attract the positive sodium ions (Na+), causing the sodium ions to travel towards the cathode end of glass wafer 115. The remaining negative ions in glass wafer 115 form a space charge on the side of glass wafer 115 adjacent to silicon wafer 120. This generates an electric field, which pulls silicon wafer 120 and glass wafer 115 together during the process. Therefore, while the voltage is applied across the wafers and the temperature is raised, an electric field pulls the wafers together. After removing the voltage, the wafers are irreversibly chemically bonded together. The force of the electric field that pulls the wafers together is given by the equation F=E/d, where E is the electric field and d is the distance or gap between the wafers. Therefore, the smaller the gap between the wafers, the greater the force generated by the electric field. This provides incentive to make the surfaces as smooth and parallel as possible, in order to achieve the maximum force for a given electric field strength.

One way to think about anodic bonding is that the silicon-oxygen (Si—O) surface bonds must be broken and reformed through contact with the other wafer. This is a relatively strong bond (approximately 560 kcal/mole), which means that a large amount of energy is required to break these bonds. This energy can come from an elevated temperature and/or application of an electric field to the multilayer or wafer structure. The best way to increase the energy of the electric field is to decrease the separation between the wafers, i.e. decrease the distance in the force equation, through having low surface roughness ($R_a$) and very good planarity. The surface roughness can be defined as $R_a = (1/L) \int_0^L |z(x) - z_{ave}| dx$, where $z(x)$ represents the surface height at a given point, and $z_{ave}$ is the average surface height. Thus, $R_a$ is the integrated absolute deviation from the mean surface height within a region (0, L). There are many descriptions of surface roughness but this one is commonly used and will be used here.

The main problem with existing processes is the necessity to use a high voltage source to generate the correspondingly high temperatures required to bond the wafers. The temperature and voltage required for this process can cause extensive damage to prefabricated printed circuit boards (PCBs). Therefore, using prior art processes, it is not possible to create an anodic bond between a glass wafer and a fully-functional silicon PCB that includes sensitive electrical components without causing significant damage to the electrical interconnects and components residing on the PCB.

In an effort to minimize space in an electrical circuit, it is often advantageous to stack boards on top of one another with interposer wafers between them. If the current anodic bonding process is used, only a single silicon wafer can be bonded with a glass wafer because the electrical components and interconnects must be added after the anodic bonding process is complete. In contrast, if one could develop an improved low-temperature, low-voltage anodic bonding process, multiple fully-functional PCBs could be bonded with multiple glass wafers.

There are other techniques for fabricating multilayer or multi-wafer substrates. Unfortunately, these other fabrication processes require even higher temperatures than required to anodically bonding silicon and glass wafers. For example, low temperature co-fired ceramic (LTCC) processes, which are common in the semiconductor and telecommunication industries, require temperatures in the range of about 850° C.

BRIEF SUMMARY OF THE EXEMPLARY EMBODIMENTS

Exemplary embodiments of the present invention relate to an improved anodic bonding process that operates at a lower temperature, such as, but not limited to, below 300 degrees Celsius (° C.) to bond multiple wafers, layers, or substrates. Since the temperatures are below 300° C., the exemplary process also operates at a lower voltage than traditional anodic bonding processes. Exemplary embodiments of the bonding processes of the invention can be used to bond multiple wafer, layers, or substrates that can be used in optical and photonics applications and other environments. The low bonding temperature permits the bonding processes to be compatible with soldered components, since these temperatures are low enough to not damage components that are designed to tolerate standard solder reflow processes. Moreover, the bonding processes are performed at a temperature that is low enough to permit passive and active components to be embedded in the bonded wafers, and to permit the use of thermally resistant polymer materials, such as polyimides, in the structures.

Exemplary embodiments of the present invention allow multiple wafers, including printed circuit board (PCB) wafers and interposer wafers, to be anodically bonded together simultaneously to form a multiple wafer structure, thus eliminating numerous steps required in the prior art. Although reference is made herein to bonding wafers, one skilled in the art appreciates that the present invention can be used to bond one or more layers. Consequently, the teaching contained herein applies also to bonding one or more layers or substrates.

In one exemplary configuration of the present invention, an amorphous thin film is applied to one of the bonded surfaces of the PCB wafers and interposer wafers to facilitate the bonding process. A low voltage is applied through the stacked wafers, including the thin film, to raise the temperature to the desired bonding temperature, and to generate the electric field required for the bonding process that results in bonding the PCB wafer the interposer wafer.

The present exemplary techniques have several advantages over existing techniques. Unlike current bonding technologies, bubbles are less likely to form during the bonding process because a relatively small area is being bonded. Further, film stress is much less a concern since the amount of film area is greatly reduced compared with bonding the entire wafer surface, as is typically the case. Also, due to the small surface are bonded, lower mechanical pressures are needed during the bonding process than typically used to bond the PCB wafer to the interposer wafer.

Additionally, the electric field used during the bonding process is concentrated along the bond lines and not through the circuitry, thereby limiting the possibility of damage to the electric circuitry. Further, the potential for creating electrical shorts is reduced because the wafer to wafer connections are made after each wafer is bonded In addition to the above, any planarization step, which smoothes the surfaces to be bonded, is significantly faster because the surface area to be smoothed is smaller. Because the speed of the planarization processes is linearly related to the amount of material to be removed, which is proportional to the area to be polished, the planarization step is faster.

These and other objects and features of the present invention will become more fully apparent from the following description and appended claims, or can be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

Reference will now be made to the drawings to describe illustrative embodiments of the present invention. It is to be understood that the drawings are diagrammatic and schematic representations of the illustrative embodiments, and are not limiting of the present invention, nor are they necessarily drawn to scale.

In general, the present invention relates to an improved anodic bonding process that operates at a lower temperature and voltage than traditional anodic bonding processes. Exemplary embodiments of the bonding processes of the invention can be used to bond multiple wafers, layers, or substrates that can be used in optical and photonics applications and other environments. As described below, the bonding temperature is low enough to permit the bonding processes to be compatible with soldered components, since these low temperatures are within the range of standard reflow processes. Moreover, the bonding processes are performed at a temperature that is low enough to permit passive and active components to be embedded in the bonded wafers or layers and to permit the use of thermally resistant polymer materials in the structures.

Although the invention is described herein primarily in the context of bonding glass wafers, the principles of the invention also extend to the bonding of other types of materials, including a variety of inorganic or hybrid organic-inorganic materials, whether or not such materials form wafers or layers. Examples include, but are not limited to, ceramics, sol-gels, silicon, sapphire, and other crystalline or polycrystalline materials.

Figure 1:
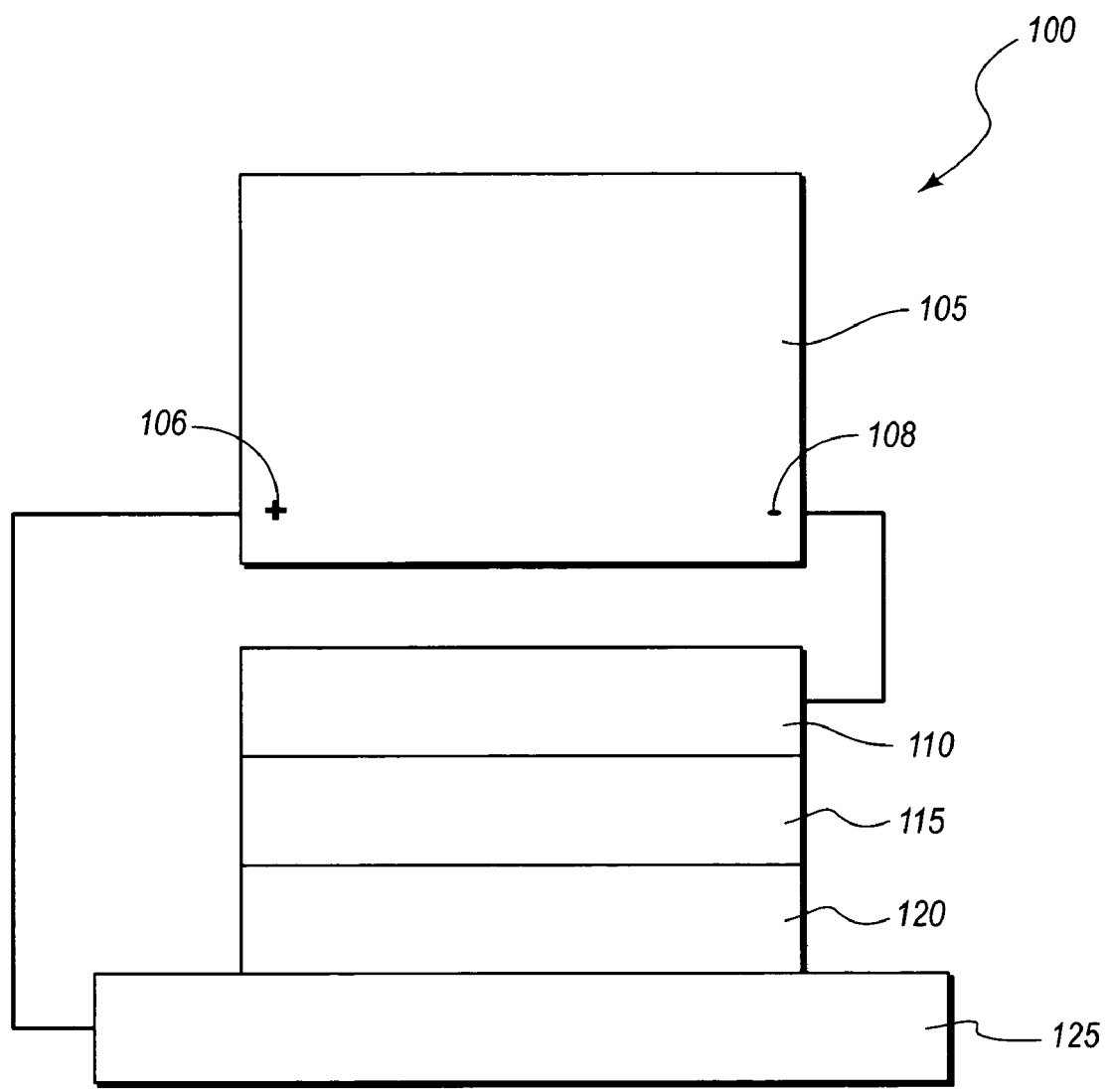
FIG. 1 illustrates a conventional system for performing a conventional anodic bonding process between a glass wafer and a silicon wafer.
Figure 2:
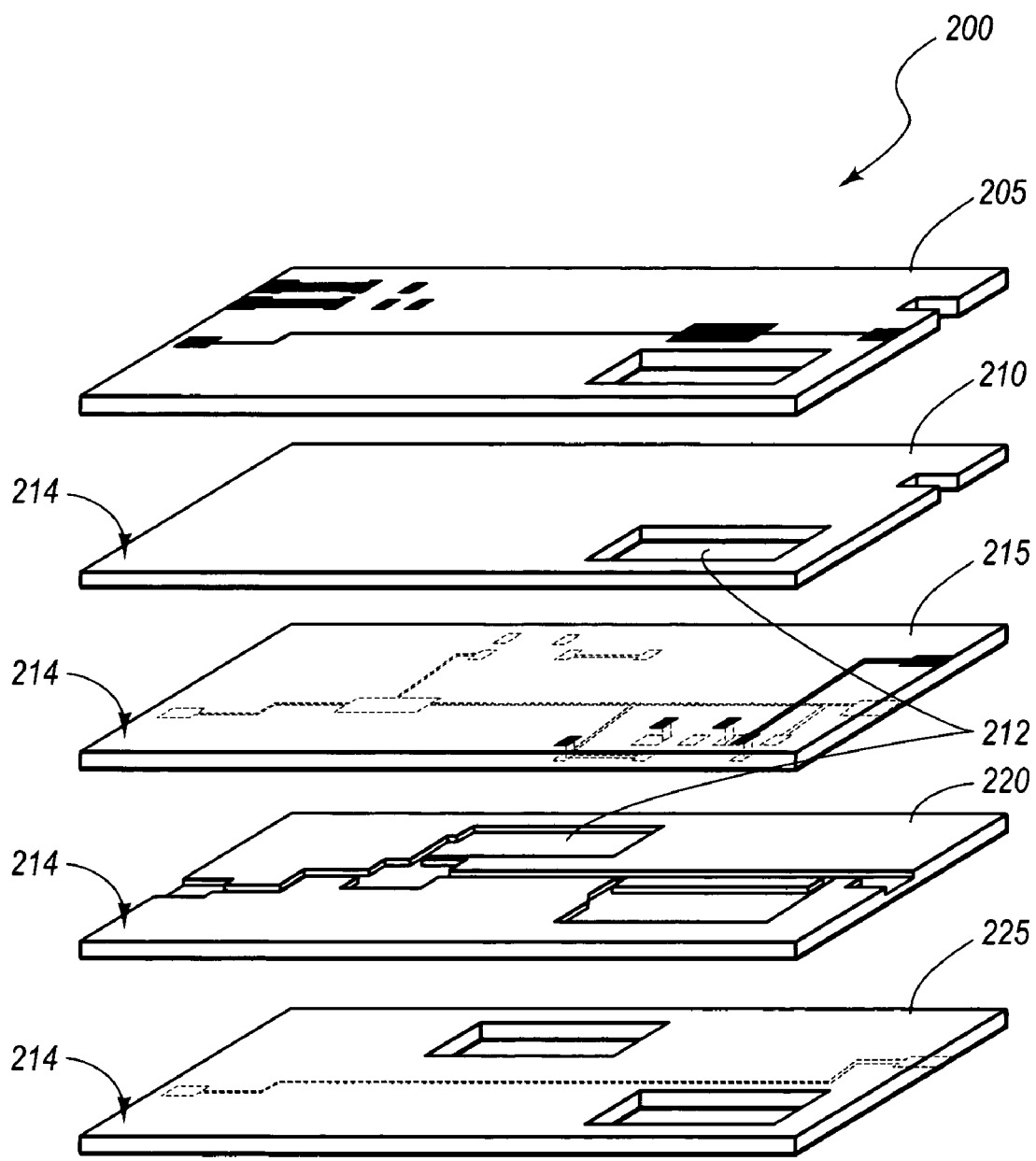
FIG. 2 illustrates an exploded view of a stacked semiconductor device in accordance with one aspect of the present invention.

Reference is made to FIG. 2, which illustrates an exploded view of an illustrative stacked semiconductor device, designated generally as reference numeral 200. Wafers 205, 215 and 225 are circuit wafers, while wafers 210 and 220 are interposer wafers that separate the adjacent circuit wafers 215 and 225. An amorphous thin film 214 is deposited on at least one of the contacting surfaces of wafers 205, 210, 215, 220 and 225 to facilitate the low temperature process. The improved anodic bonding process is used to bond the illustrated semiconductor and glass wafers 205, 210, 215, 220, 225 together without interfering with the existing circuitry on the individual wafers.

As shown in FIG. 2, indentations or cutouts 212 on interposer wafers 210 and 220 provide clearance so that the patterned portions of circuit wafers 205, 215, 225 do not interfere with the contact between interposer wafers 210 and 220 and circuit wafers 205, 215, 225. Although interposer wafers 210 and 220 are generally a patterned piece of glass, other materials are not precluded. For instance, interposer wafers 210 and 220 can be fabricated from spin-on inorganic or hybrid organic/inorganic material, such as sol-gels, silicon, sapphire, and other crystalline or polycrystalline materials. Also, the number of wafers, layers, or substrates is arbitrary. Exemplary embodiments of the devices and methods of the present invention allow the use of greater than 2 wafers, layers, or substrates.

The interposer wafers 210 and 220 can be formed in a number of ways. One particularly convenient way is to use one or more of circuit wafers 205, 215, and 225 as a mold before forming the holes in circuit wafer 205, 215, 225 for mounting the integrated circuits or the like. For example, a sol-gel mold can be made of the surface profile of one or more of circuit wafers 205, 215, 225. This sol-gel mold can be subsequently photo-polymerized, etched to ensure adequate clearance, and finally densified into a glass-like plate. This plate can then be polished and surface activated for bonding to the circuit wafers 205, 215, 225.

Alternately, interposer wafers 210 and 220 can be formed by laser diffusion of the traces and some of the passive components directly into the glass substrate. This eliminates the problem of features being above the surface. Yet another method of alleviating surface relief issues is to recognize that in most cases, the goal of the bonding of the wafers is to form a hermetic or nearly hermetic package. This can be accomplished by bonding the edges of the region containing a circuit, as will be discussed in more detail below with reference to FIG. 3.

Returning to FIG. 2, the bonding process associated with bonding multiple wafers, layers, or substrates is facilitated by preparation of the surfaces of the wafers that are to be bonded. This preparation process can include achieving a surface that is sufficiently smooth to enable direct contact between adjacent wafers. The process of smoothing the surface is sometimes known as Chemical Mechanical Planarization (CMP). The preparation process can further include activating the surface of one or more of wafers 205, 210, 215, 220, 225 using chemical or electrical activation techniques, and obtaining an interposer design that provides adequate contact between wafers 205, 210, 215, 220, 225 while providing clearance for circuit features of circuit wafers 205, 215, 225. These activation techniques can include aggressive chemical cleaning of portions of wafers 205, 210, 215, 220, 225 and/or $H_2$ plasma activation. The plasma activation is generally an attempt to increase the populations of hydrogenated and hydroxylated species on the surface of one or more of wafers 205, 210, 215, 220, 225. For example, in the case of silicon barrier wafers it is desired to increase the surface concentration of Si—OH and Si—H.

With continued reference to FIG. 2, first wafer 205 can be formed from a rigid material, such as a semiconductor, a ceramic, a glass, or some combination thereof. Applied to first wafer 205 is amorphous thin film 214 that creates a high surface energy on, for example, a surface of first wafer 205. The amorphous thin film 214 can be, by way of example and not limitation, silicon, silicon suboxide, or any other film with the desired barrier properties that is compatible with the wafer substrate.

The high surface energy of first wafer 205 allows the materials in first wafer 205 and second wafer 210 to form more bonds with one another during the anodic bonding process. This increases the bond strength between the two wafers 205 and 210. It will be understood that the thin film 214 can be applied to second wafer 210 rather than first wafer 205. Consequently, the high surface energy of second wafer 210 allows the materials in first wafer 205 and second wafer 210 to form more bonds with one another during the anodic bonding process.

As a specific example of a process that can be used to achieve the bonding between first wafer 205 and second wafer 210, the surface coated with the thin film coating 214 are activated in a hydrogen plasma to form silicon-hydrogen (Si—H), and silicon-oxygen-hydrogen (Si—O—H) coated surfaces. Bringing these surfaces together under vacuum, heat, and some mechanical pressure in an electric field, forms Si—O—Si, Si—Si, and Si—O—O—Si bonds. This process can be used to bond multiple wafers at once, which is a marked improvement in the art.

The amorphous thin film 214 has certain barrier properties. The important properties for the deposited barrier layer are: 1) that it be able to effectively block the mobile ions in the substrate, wafer or layer; 2) that it match the coefficient of linear thermal expansion (CTE) of the substrate, wafer or layer well enough so that film stress is not a problem; and 3) that it have sufficient dielectric strength to survive, not punch through, the applied electric field. The thinner the film can be, the better for bonding. Additional criteria for the film can be application dependant. For example, when passing light in the visible region is important, then silicon suboxides may be used to provide the desired attenuation levels.

As mentioned previously, the force that draws the wafers, layers, or substrates together and that is at least partially responsible for breaking the bonds comes from the electric field created by blocking the ion migration. Since it is the deposited thin film 214 that blocks the ions, the maximum electric field strength is determined by the thickness of film 214. This thickness can range from about 20 nm to about 50 nm, although thicknesses greater and lesser than this range are possible. The actual force will be less because there will be some space between the deposited barrier layer and the next substrate, wafer, or layer. Hence, the constant mention about surface roughness and planarity. In the bonding process, the wafer, layer, or substrate is held and the mechanical pressure applied such that the center bonds first. Thus, the bonding ideally starts in the center of the wafer, layer, or substrate and proceeds to the edge. This way there are no "bubbles" in the resultant bonded wafer, layer, or substrate stack.

In most cases, it is sufficient to bond along the saw streets such that, after dicing, there is sufficient bonded area to insure hermeticity and mechanical strength. The mechanical strength can be between 2 GPa and 10 GPa, although other mechanical strengths higher or lower than this range is possible. This implies that one square millimeter can support a suspended weight of at least 200 kg. As an example, a 100 µm bond line, after dicing around a 1 mm square chip, should support at least 80 kg. This has been verified experimentally. Forming these waffle-like bonded areas can be the most practical, high volume application of this technique. Because the bond line is relatively thin, a few hundred microns generally, the bubble problem is nearly nonexistent. Also, the field is concentrated along these bond lines and away from the circuitry, eliminating concern about electrostatic discharge damage to the circuit components.

One example of an embodiment of a bonding process according to one aspect of the present invention is illustrated in FIGS. 3A-3E, and designated generally as reference numeral 300. In this configuration, a hermetically sealed package is formed by bonding one wafer to another wafer along the edges of the wafers, and optionally and discrete locations on the surfaces of the wafers, rather than over the entire surface of the wafers.

Figure 3A:
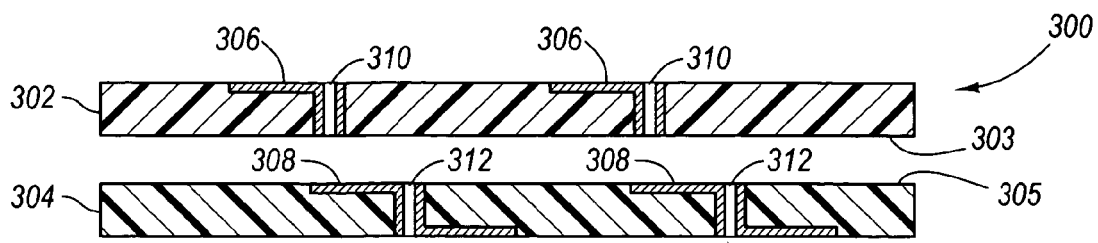
FIGS. 3A-3E illustrate the steps in one exemplary process of anodic bonding according to an alternate aspect of the present invention.

In the illustrated example, and with reference to FIG. 3A, a first wafer 302 having a first bond surface 303 is to be bonded to a second wafer 304 having a second bond surface 305 using a waffle technique. FIG. 3A represents a circuit fabrication process, in which the various electrical components/circuits are formed on wafers 302, 304. This circuit fabrication process was discussed in detail above with respect to FIG. 2.

First wafer 302 is a circuit wafer that can include one or more electrical components 306 and one or more through holes 310. Second wafer 304 can be an interposer wafer that can also include one or more electrical components 308 and one or more through holes 312. Components 306, 308 can be any type of electrical component normally found on a printed circuit board, such as, but not limited to, resistors, capacitors, microchips, electrical pathways, etc. Through holes 310 can facilitate the electrical connection of the various circuits on wafer 302 with one or more electrical components 308 on wafer 304.

Figure 3B:
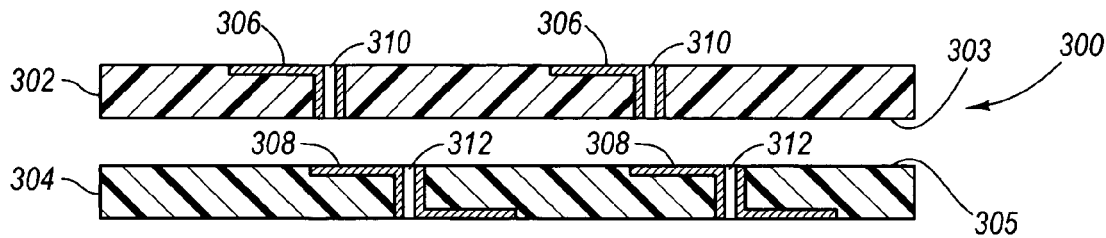

With reference to FIG. 3B, a chemical mechanical planarization (CMP) process can be used to smooth surfaces 303, 305 to be bonded. Specifics of this process were also discussed above with reference to FIG. 2. While useful in some exemplary embodiments, the CMP process step is optional.

Figure 3C:
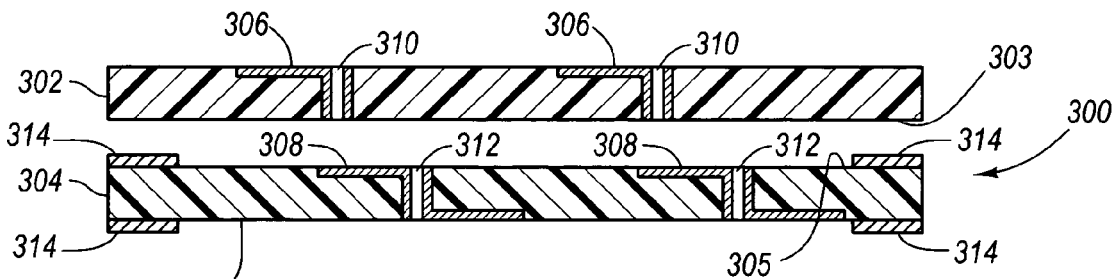

With reference to FIG. 3C, an amorphous thin film 314 can be applied to one or more of surfaces 303, 305 of wafers 302, 304, respectively. In anticipation of bonding multiple wafers, thin film 314 can also be applied to a lower surface 307 of wafer 304. As discussed above with reference to FIG. 2, this amorphous thin film 314 can be, by way of example and not limitation, silicon, silicon suboxide, or any other film with the desired barrier properties that is compatible with the wafer substrate. Specific properties for the barrier film were also discussed above with reference to FIG. 2. As shown, this thin film 314 is applied to the edges of wafer 302 and 304. One skilled in the art will understand, that in other embodiments, thin film 314 can be applied to substantially all of surface 305 of wafer 304 or substantially all of surface 303 of wafer 302. Similarly, thin film 314 can be applied to substantially all of surface 307 of wafer 304 when the same is to bond with another wafer, layer, or substrate.

Figure 3D:
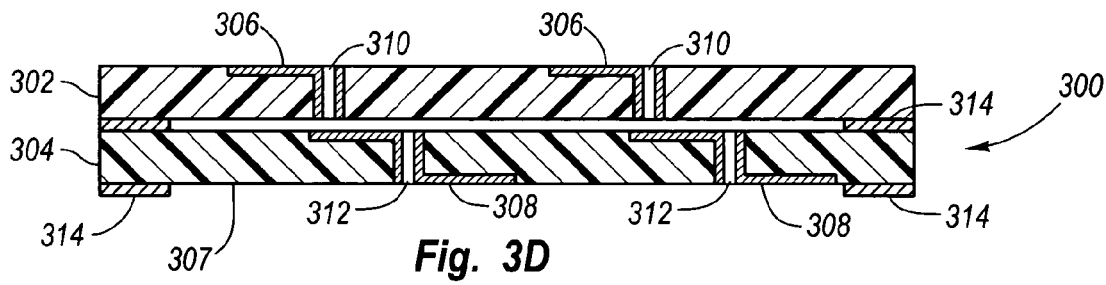

FIG. 3D represents the step of placing wafers 302 and 304 in contact with each other and applying a voltage across them. Mechanical pressure can be applied to hold both surfaces 303 and 305 in contact with each other at the locations where thin film 314 is deposited. Once the surfaces 303 and 305 are contacting, a voltage of approximately hundreds of volts is applied, sufficient to raise the temperature of contact surfaces 303, 305 to about 250 degrees C. The primary function of the temperature is to reduce the migration time of the ions to the boundary of the barrier layer, i.e., thin film 214. The electric field performs the function of drawing the wafers together and also activating the bonding process. Consequently, the electric field causes permanent bonding of surface 303 to surface 305 at the location where thin film 314 is deposited.

Figure 3E:
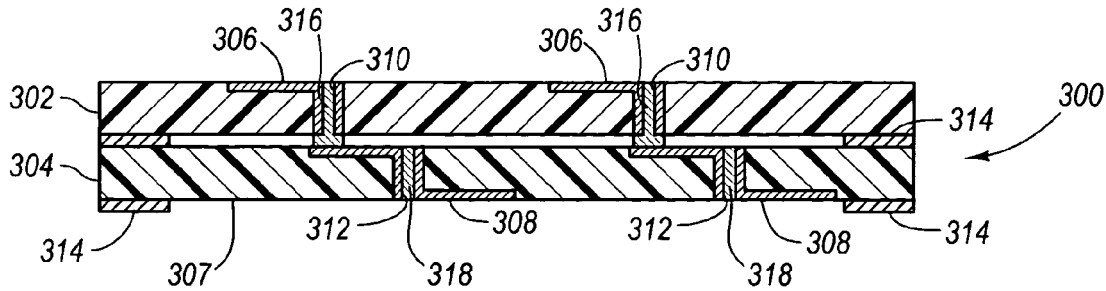

FIG. 3E illustrates the step of filling the holes 310, 312 with an electrically conductive filler material 316, 318, respectively. The filler material makes the actual electrical connections between wafers 302, 304. Filler material 316, 318 can be, by way of example and not limitation, any of various types of electrical solder.

The waffle technique described above with reference to FIGS. 3A-3E has several advantages. Bubble formation is not a problem, since a relatively small area is actually being bonded, i.e, bonding of surfaces 303 and 305 where thin film 314 is deposited. Less mechanical pressure is needed because the applied pressure is distributed over a much surface area defined by thin film 314. The electric field is concentrated along the bond lines defined by thin film 314 and not through the circuitry. Film stress is much less a concern since the amount of film area is greatly reduced compared with bonding the entire wafer surface. Any planarization step (CMP process) is significantly faster because only those portions of surfaces having thin film 315 need receive planarization. Because the speed of such processes is usually linearly related to the amount of material to be removed, which is proportional to the area to be polished, the process is faster. Finally, the potential of an electrical short being formed is reduced because the wafer to wafer connections 316, 318, are made after each wafer is bonded.

The process described with respect to FIGS. 3A-4F can be repeated as often as necessary to create the desired structure of multiple interconnected wafers, layers, or substrates.

FIGS. 4A-4F illustrate another exemplary embodiment of an anodic bonding process where a bond is formed over an entire surface of a wafer, rather than at discrete locations, as described with respect to FIGS. 3A-3E.

Figure 4A:
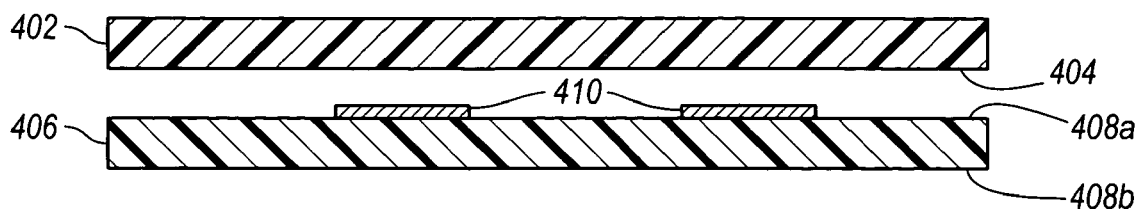
FIGS. 4A-4F illustrate the steps in an alternative exemplary process of anodic bonding according to an alternate aspect of the present invention.

With reference to FIG. 4A, illustrated is a first wafer 402 having an inside surface 404, and a second wafer 406 having an inside surface 408*a* and an outside surface 408*b*. Applied to inside surface 408*a* are various circuits/components 410. Application of these various circuits/components 410 can occur using a metal sputtering and patterning techniques or steps known to those skilled in the art. In alternative exemplary embodiments of the present invention, electrical components and/or circuits can also be applied to surface 404 of wafer 402.

Figure 4B:
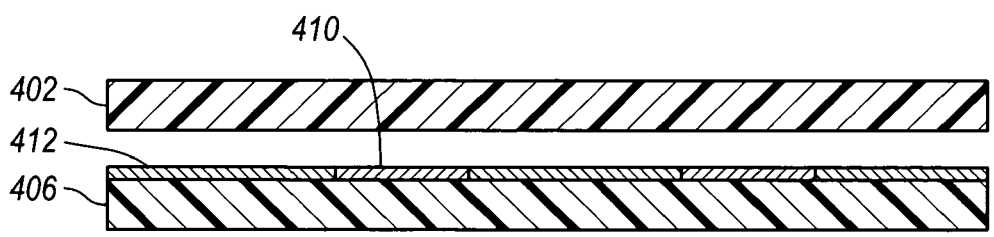
Figure 4C:
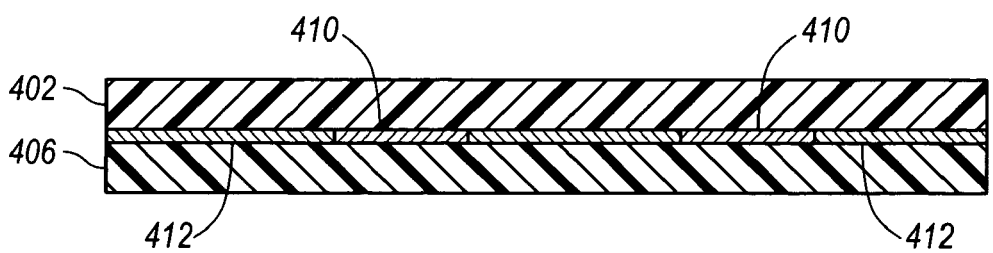

With reference to FIG. 4B, applied around circuits 410 is a thin film 412. Film 412 can be any of the thin films previously discussed with reference to the other embodiments of the present invention. This thin film 412 aids with bonding wafer 402 to wafer 406. Once mechanical pressure is applied to ensure good contact between surfaces 404, 408*a* and thin film 412, as illustrated in FIG. 4C, an electrical voltage of approximately hundreds of volts is then applied across wafers 402, 406 to effectuate the bonding process, as previously described with reference to FIGS. 2 and 3.

Figure 4D:
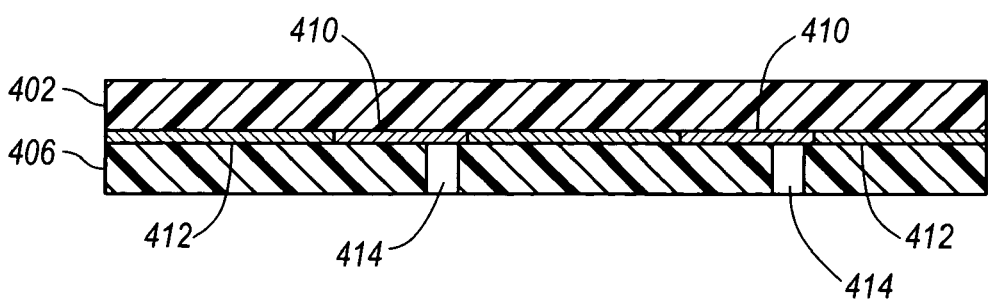
Figure 4E:
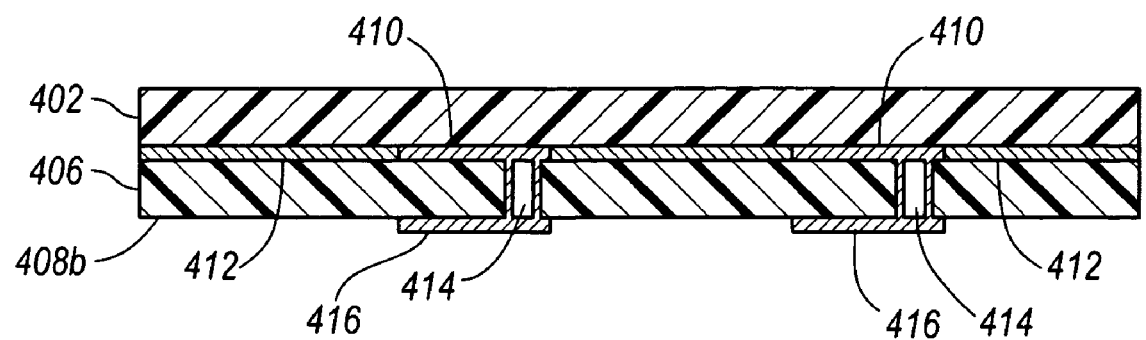

Once wafers 402, 406 have been bonded, holes 414 can be drilled into the wafers to make the electrical connections between the wafers, as illustrated in FIG. 4D. These holes 414 can be made using laser drilling, or any other form of etching known to those of skill in the art. Additional circuits/components 416 can be applied to a surface 408*b* of wafer 406 using a similar technique to that described with respect to FIG. 4A.

Figure 4F:
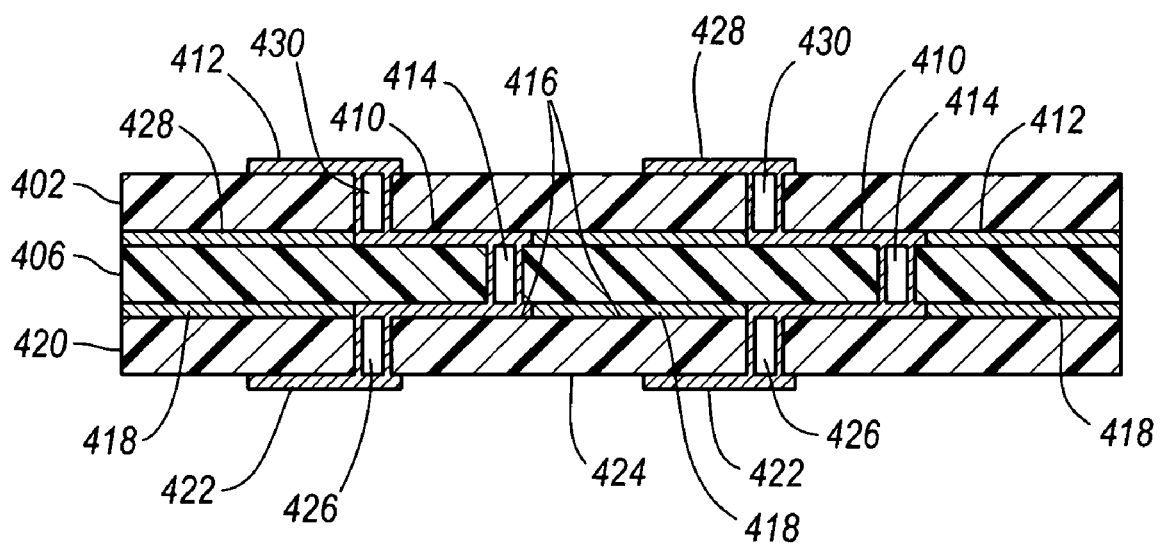

The process described with respect to FIGS. 4A-4E can be repeated as often as necessary to create the desired structure of multiple interconnected wafers, layers, or substrates. An exemplary embodiment of a stack formed using the process of FIGS. 4A-4E is illustrated in FIG. 4F.

As shown, an additional wafer 420 is bonded to wafer 406 using thin film 418. As previously described, additional circuitry 422 can be applied to a surface 424 of wafer 420. Holes 426 can then be drilled in wafer 420 to make electrical connections to circuitry 422. Additional circuitry 428 can also be added to wafer 402. Holes 430 can then be drilled in wafer 402 to make electrical connections to circuitry 410 on wafer 406. In this exemplary embodiment, only three wafers 402, 406, 420 have been bonded. However, those skilled in the art will realize that the exemplary process works with two or more wafers, layers, or substrates to form multilayer, multiple wafer, or multiple substrate stack. Any electrical short problem is avoided in this case by forming holes 414, 426, 430 after the bonding process. One can cycle through the intermediate steps as many times as necessary to build up the desired number of wafers, layers, or substrates before progressing to the last step where the final connections to the top and bottom surfaces are made.

Multiple interconnections between wafers, layers, or substrates (not shown) can be formed after performing the final bonding step. After forming these connections, there will generally be an electrical connection through and/or around the stack, so that additional wafers can no longer be bonded to the stack. It should be mentioned that through thoughtful design it is possible to include a testing ability for intermediate steps in the event that there are multiple wafers, layers, or substrates. Although in general there is no way to fix problems after the wafers, layers, or substrates are bonded, the yet-to-be-bonded wafers, layers, or substrates can be salvaged once a problem is found in the bonded stack.

The exemplary improved anodic bonding process of the present invention can be performed at temperatures of about 250° C., 275° C., 300° C., or some other temperatures than the identified temperatures to avoid damaging embedded components or solder connections on the semiconductor wafers. More generally, the anodic bonding process can be performed at temperatures greater than 250° C.

The voltage across the substrates, wafers, or layers can be approximately 900 volts, 700 voltages, and more generally about the higher hundreds of volts, but other voltages can be used based upon the materials being used and the temperature desired.

The present invention can be embodied in other specific forms without departing from its spirit or essential characteristics. The described embodiments are to be considered in all respects only as illustrative and not restrictive. The scope of the invention is therefore, indicated by the appended claims rather than by the foregoing description. All changes which come within the meaning and range of equivalency of the claims are to be embraced within their scope.

What is claimed is:

1. A substrate comprising:
   at least one circuit wafer;
   at least one interposer wafer, said at least one interposer wafer including an indentation or cutout that provides clearance over a circuit pattern on said at least one circuit wafer; and
   an amorphous thin film between said circuit wafer and said interposer wafer, wherein said at least one circuit wafer is anodically bonded to said at least one interposer wafer at a temperature below about 300 degrees Celsius.

2. The substrate of claim 1, wherein said at least one circuit wafer comprises a printed circuit board on a substrate.

3. The substrate of claim 2, wherein said substrate comprises one of ceramics, sol-gels, silicon, and glass.

4. The substrate of claim 1, wherein said at least one interposer wafer comprises one of ceramics, sol-gels, silicon, and glass.

5. The substrate of claim 1, wherein said amorphous thin film comprises one of silicon and silicon suboxide.

6. The substrate of claim 1, further comprising a plurality of circuit wafers arranged such that at least one interposer wafer is disposed between two circuit wafers of any given pair of circuit wafers.

7. The substrate of claim 6, wherein each of said plurality of circuit wafers comprises a printed circuit board on a substrate.

8. The substrate of claim 7, wherein said substrate comprises one of ceramics, sol-gels, silicon, and glass.

9. The substrate of claim 6, wherein each of said at least one interposer wafers comprises one of ceramics, sol-gels, silicon, and glass.

10. The substrate of claim 6, wherein at least one of said interposer wafers includes an indentation that provides clearance over a circuit pattern on at least one of said plurality of circuit wafers.

11. The substrate of claim 1, wherein said temperature is about 250 degrees Celsius.

12. The substrate of claim 1, wherein a voltage of approximately 700 volts is applied to said at least one circuit wafer and said at least one interposer to achieve said temperature.

13. A substrate comprising:
   a semiconductor circuit wafer having first and second surfaces, wherein at least one of the first and second surfaces includes printed circuit traces;
   a first thin film deposited on the first surface of the semiconductor circuit wafer;
   an interposer wafer having first and second surfaces;
   a second thin film deposited on the first surface of the interposer wafer such that the second thin film is positioned between the first surface of the interposer wafer and the second surface of the semiconductor circuit wafer; and
   wherein said semiconductor circuit wafer is anodically bonded to said interposer wafer at a temperature below about 300 degrees Celsius.

14. The substrate as recited in claim 13, wherein the interposer wafer defines a clearance region positioned proximate to the printed circuit traces of the semiconductor circuit wafer.

15. The substrate as recited in claim 13, wherein the interposer wafer comprises one of ceramics, sol-gels, silicon, glass, and sapphire.

16. The substrate as recited in claim 13, wherein one of the first and second thin films comprises one of silicon, and silicon suboxide.

17. A substrate comprising:
   a circuit wafer having a side with printed circuit traces; and
   an interposer wafer upon which a thin film is deposited, the interposer wafer being arranged so that the thin film is located between the interposer wafer and the side of the circuit wafer that includes the printed circuit traces, wherein said semiconductor circuit wafer is anodically bonded to said interposer wafer at a temperature below about 300 degrees Celsius.

18. The substrate as recited in claim 17, wherein the interposer wafer defines a clearance region positioned proximate to the printed circuit traces of the semiconductor circuit wafer.

19. The substrate as recited in claim 17, wherein the thin film comprises one of silicon, and silicon suboxide.

* * * * *

UNITED STATES PATENT AND TRADEMARK OFFICE
CERTIFICATE OF CORRECTION

PATENT NO.         : 7,259,466 B2                                                        Page 1 of 1
APPLICATION NO. : 10/740241
DATED              : August 21, 2007
INVENTOR(S)        : Freeman et al.

It is certified that error appears in the above-identified patent and that said Letters Patent is hereby corrected as shown below:

Drawings
Sheet 5, replace Fig. 4F with the figure depicted herein below, wherein one instance of the reference "412" has been switched with one instance of the reference "428"

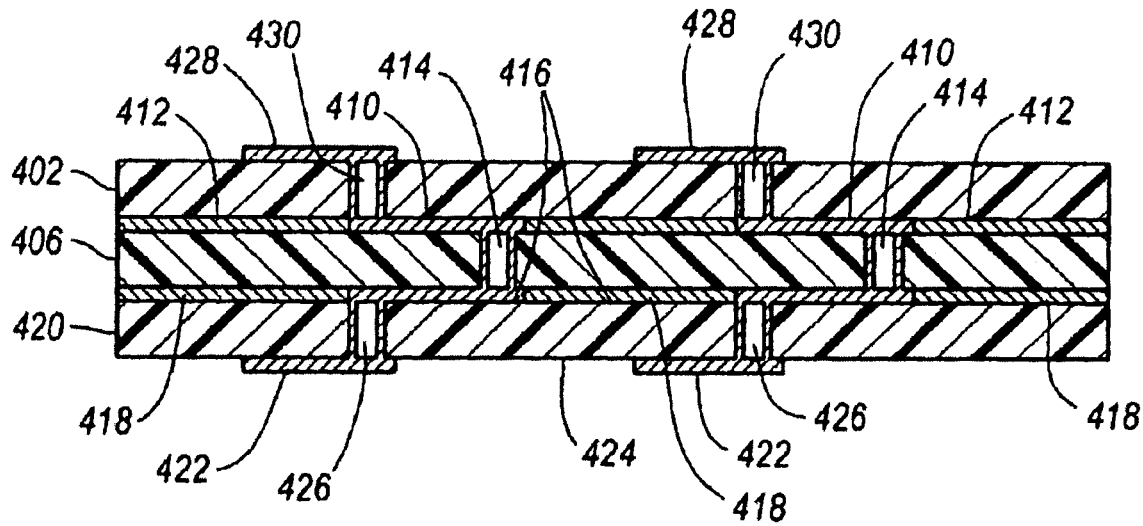

Fig. 4F

Column 7
Line 61, change "315" to --314--

Signed and Sealed this

Sixteenth Day of March, 2010

David J. Kappos
*Director of the United States Patent and Trademark Office*